(12) United States Patent
Craig et al.

(10) Patent No.: US 7,695,309 B2
(45) Date of Patent: Apr. 13, 2010

(54) SENSOR STRIP FOR A CONNECTIVITY MANAGEMENT SYSTEM

(75) Inventors: Darrell Wayne Craig, Stokesdale, NC (US); James Gregory Garrett, Lexington, NC (US); Tony Edward Beam, Belews Creek, NC (US)

(73) Assignee: Tyco Electronics Corporation, Berwyn, PA (US)

( * ) Notice: Subject to any disclaimer, the term of this patent is extended or adjusted under 35 U.S.C. 154(b) by 36 days.

(21) Appl. No.: 12/198,738

(22) Filed: Aug. 26, 2008

(65) Prior Publication Data

US 2010/0055971 A1 Mar. 4, 2010

(51) Int. Cl.
*H01R 3/00* (2006.01)
(52) U.S. Cl. ..................................... 439/489
(58) Field of Classification Search ................... 439/489
See application file for complete search history.

(56) References Cited

U.S. PATENT DOCUMENTS

| | | | |
|---|---|---|---|
| 6,626,697 B1 | 9/2003 | Martin et al. | |
| 6,967,867 B2 | 11/2005 | Hamaguchi | |
| 6,976,867 B2 * | 12/2005 | Navarro et al. | 439/489 |
| 7,309,260 B2 | 12/2007 | Brower et al. | |
| 7,347,950 B2 | 3/2008 | Myung et al. | |
| 7,591,667 B2 * | 9/2009 | Gatnau Navarro et al. | 439/489 |
| 2004/0219827 A1 | 11/2004 | David et al. | |
| 2007/0238343 A1 * | 10/2007 | Velleca et al. | 439/188 |

FOREIGN PATENT DOCUMENTS

WO WO 2007/025223 A1 3/2007

OTHER PUBLICATIONS

International Search Report, International Application No. PCT/US2009/004579, International Filing Date Nov. 8, 2009.

\* cited by examiner

*Primary Examiner*—Briggitte R Hammond

(57) ABSTRACT

A network panel includes a panel having a plurality of openings and interconnect modules received in the openings. Each interconnect module has a mating face and a plurality of receptacle jacks. Each receptacle jack has an opening at the mating face defining a port configured to receive a plug of a patch cord having the sensing probes. The network panel also includes a sensor strip having one or more headers and one or more flexible circuits interconnecting a plurality of rigid circuit boards with the header. Each of the circuit boards have contact pads and the sensor strip is mounted to at least one of the panel and the interconnect modules such that the contact pads are aligned with respective receptacle jacks. The contact pads are configured to interface with sensing probes when the plug is mated with the receptacle jacks.

20 Claims, 5 Drawing Sheets

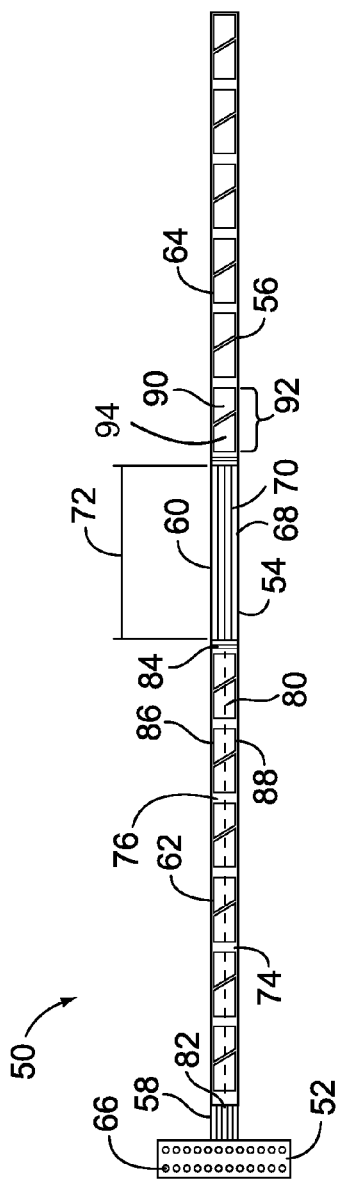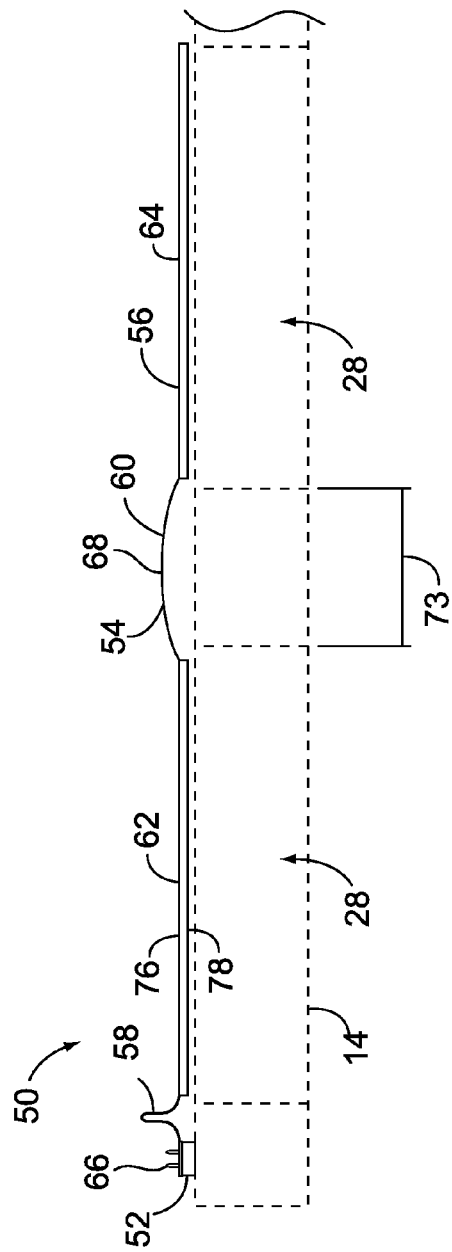

SENSOR STRIP FOR A CONNECTIVITY MANAGEMENT SYSTEM

BACKGROUND OF THE INVENTION

The subject matter herein relates generally to connectivity management systems, and more particularly to sensor strips used in connectivity management systems.

Electrical network systems typically include interconnect modules that is retained in a network panel, such as a patch panel or a network switch, or any number of other network structures. The interconnect module interconnects two separate network components. The interconnect module includes receptacle jacks, such as modular jacks, at a mating face. The receptacle jacks receive patch cords that in turn are connected to a first network component. Each patch cord includes an electrical cable comprised of signal wires connected to a plug at one end. The plug is received within a corresponding receptacle jack such that the signal wires in the electrical cable are electrically connected to signal contacts extending from a rear side of the interconnect module. The signal contacts are in turn connected to a second set of signal wires that extend to a second network component. Thus, the interconnect module electrically interconnects the first and second network components.

In order to better operate large electrical networks, connectivity management systems have been developed to monitor connections between components within the network. Network systems that use interconnect modules typically include a sensor arranged along a mating face of the interconnect module. The sensor is positioned to interface with a sensor probe of the plug when the plug is mated with the receptacle jack. Some known connectivity management systems include sensors that are hardwired into the interconnect module. Other known connectivity management systems include a sensor strip that is coupled to the interconnect module. In either type of system, the sensors are designed specifically for the network panel and/or the interconnect modules. For example, the network panels typically include a plurality of interconnect modules that are spaced apart by a predetermined distance. Different network panels are designed such that the interconnect modules are spaced apart by different distances. As a result, the sensor are designed specifically to the network panel and the corresponding interconnect modules and a given sensor may not be utilized with a different network panel having a different configuration of interconnect modules. One example of a known sensor is a rigid circuit that is mounted to a network panel. The rigid circuit sensor is designed specifically to fit a given layout of interconnect modules when the rigid circuit is placed along the network panel. The problem with the known rigid circuit sensors is that, since the rigid circuits are designed to fit one particular type of network panel, each network panel may require a different sensor.

A need remains for sensor that may be manufactured and installed in a cost-effective and reliable manner. A need remains for a sensor that may be used with different network panels and/or interconnect modules.

BRIEF DESCRIPTION OF THE INVENTION

In one embodiment, a network panel is provided that includes a panel having a plurality of openings and interconnect modules received in the openings. Each interconnect module has a mating face and a plurality of receptacle jacks. Each receptacle jack has an opening at the mating face defining a port configured to receive a plug of a patch cord having the sensing probes. The network panel also includes a sensor strip having one or more headers and one or more flexible circuits interconnecting a plurality of rigid circuit boards with the header. Each of the circuit boards have contact pads and the sensor strip is mounted to at least one of the panel and the interconnect modules such that the contact pads are aligned with respective receptacle jacks. The contact pads are configured to interface with sensing probes when the plug is mated with the receptacle jacks.

Optionally, the sensor strip may include first and second circuit boards, wherein a first flexible circuit may connect the first circuit board with the header and a second flexible circuit may connect the second circuit board with the first circuit board. The spacing between the circuit boards may be varied by flexing the flexible circuits. The circuit boards may be aligned with one another along a plane, wherein one of the flexible circuits extends between adjacent circuit boards, and the flexible circuits are configured to be non-coplanar with the circuit boards. Optionally, one of the flexible circuits may extend between the header and the first circuit board, wherein the spacing between the header and the first circuit boards may be varied by the flexible circuit. The receptacle jacks may be arranged with respect to one another to define a port group and the contact pads may have a pad configuration that complements the port group. The flexible circuits may be configured to send a signal to the header when at least one of the contact pads is engaged with the sensor probe. The receptacle jacks may be arranged in a plurality of rows within the interconnect module and the sensor strip may be mounted to the interconnect module between the rows of receptacle jacks.

In another embodiment, a sensor strip is provided for a connectivity management system utilizing sensor probes to determine connectivity of plugs. The sensor strip includes a header for connecting the sensor strip to other components of the connectivity management system. The sensor strip also includes a plurality of rigid circuit boards with each of the circuit boards having contact pads configured to be aligned with receptacle jacks for interfacing with the sensor probes of the plugs. A plurality of flexible circuits interconnect the circuit boards with the header. Optionally, the contact pads may be arranged in a pad configuration having each contact pad aligned with a corresponding receptacle jack so that the sensor probe of the plug engages the contact pad when the plug is loaded into the receptacle jack. Each flexible circuit may include traces that are electrically connected to selected ones of the contact pads.

In a further embodiment, a connectivity management system is provided that includes an analyzer configured to determine connectivity of plugs having sensor probes. The connectivity management system also includes a network panel having a panel and a plurality of interconnect modules coupled to the panel. Each interconnect module has a plurality of receptacle jacks with ports configured to receive the plugs. The connectivity management system also includes a sensor strip having a header and a plurality of flexible circuits interconnecting a plurality of rigid circuit boards with the header. The header is configured to be electrically connected to the analyzer by a cable. The circuit boards have contact pads. The sensor strip is mounted to the network panel such that the contact pads are aligned with respective receptacle jacks. The contact pads are configured to interface with the sensing probes when the plugs are mated with the receptacle jacks.

BRIEF DESCRIPTION OF THE DRAWINGS

FIG. 2 is a front view of a sensor strip for use with the connectivity management system shown in FIG. 1.

FIG. 3 is a side view of the sensor strip.

DETAILED DESCRIPTION OF THE INVENTION

Figure 1:
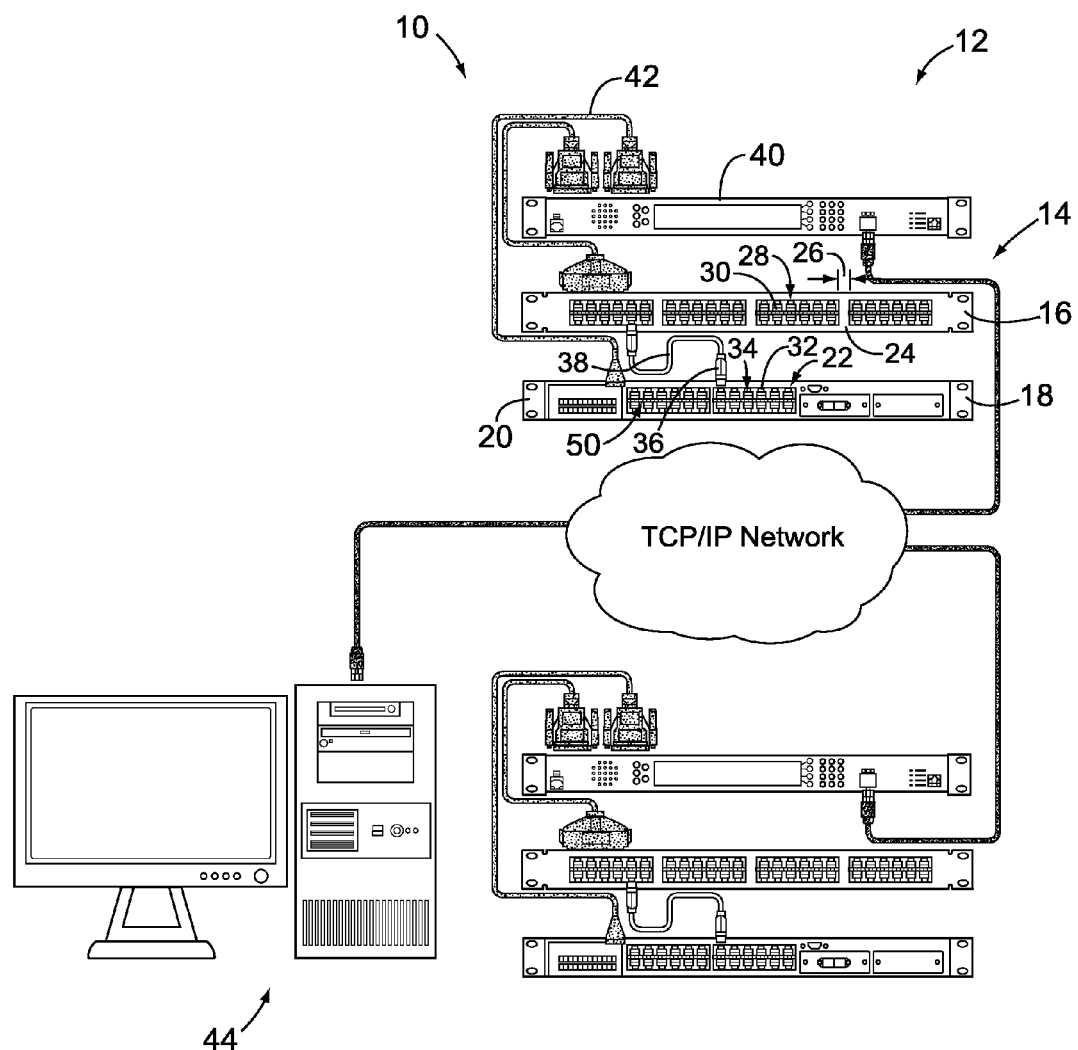
FIG. 1 illustrates an exemplary network system having a connectivity management system comprising a sensor strip formed in accordance with an exemplary embodiment.

FIG. 1 illustrates an exemplary network system 12 having a connectivity management system 10. The connectivity management system 10 determines the connectivity of components within the network system 12. The network system 12 includes a plurality of network panels 14, such as patch panels 16 and/or network switches 18. Any number of patch panels 16 and/or network switches 18 may be provided within the network system 12. Optionally, the network panels 14 may be mounted to a rack (not shown) in a stacked configuration. The network panels 14 may be interconnected with one another and/or other network components by patch cords 38. The other network components to be located remote with respect to the network panels 14.

In an exemplary embodiment, the network panels 14 include a panel 20 having a plurality of openings 22. The panel 20 may be mounted to the rack (not shown). The openings 22 may be separated by rails 24 and are spaced apart from one another by a distance 26. The network panels 14 also include interconnect modules 28 that are received in the openings 22 and mounted to the panel 20. Optionally, the distance 26 separating the interconnect modules 28 of the patch panels 16 may be different than the distance 26 separating the interconnect modules 28 of the network switches 18. Each interconnect module 28 has a mating face 30 and a plurality of receptacle jacks 32. Each receptacle jack 32 has an opening defining a port 34 at the mating face 30. The combination of ports 34 of each interconnect module 28 constitute a port group. The receptacle jacks 32 receive plugs 36 of the patch cords 38 through the ports 34. The receptacle jacks 32 are arranged with respect to one another such that the port group defines a port configuration having rows and columns of ports 34. The port configuration may have any number of rows and/or columns. In the illustrated embodiment, each port group has a port configuration of twelve ports 34 arranged as two rows and six columns of ports 34. In alternative embodiments, the port group may have more or less than twelve ports 34 and the port configuration may have a different number of rows and/or columns.

The connectivity management system 10 includes sensor probes 100 (see FIG. 4) associated with each plug 36, one or more sensor strips 50 located adjacent each jack port 34 and an analyzer 40 configured to determine the connectivity (e.g. which plug 36 is connected to which receptacle jack 32 and/or where each patch cord 38 is routed within the network system 12). Each sensor probe 100 contacts the corresponding sensor strip 50 when the plug 36 is mated to the jack port 34. The sensor strip 50 then carries a connectivity signal or connectivity data to the analyzer 40.

In an exemplary embodiment, the analyzer 40 is an analyzing device, such as the AMPTRAC Analyzer commercially available from Tyco Electronics Corporation. Optionally, the analyzer 40 may be mounted to the rack. Alternatively, the analyzer 40 may be positioned remote from the rack and the network panels 14. The network panels 14 are connected to the analyzer 14 by cable connectors 42. As described in further detail below, data relating to the connectivity or interconnection of the patch cords 38 is transmitted to the analyzer 40 by the cable connectors 42. In an exemplary embodiment, the analyzer 40 is interconnected with a computing device 44 by an Ethernet connection or another connection, such as a direct connection by a cable connector. The connectivity data is gathered by sensor strips 50 attached to the network panels 14 that sense when the plugs 36 are mated with the receptacle jacks 32. The connectivity data gathered by the analyzer 40 may be transmitted to the computing device 44 and then viewed, stored and/or manipulated by the computing device 44. Alternatively, the analyzer 40 may store and/or manipulate the connectivity data. Optionally, the analyzer 40 and the computing device 44 may be one device. Optionally, multiple analyzers 40 may be connected to the computing device 44.

FIG. 2 is a front view of a sensor strip 50 for use with the connectivity management system 10 (shown in FIG. 1). FIG. 3 is a side view of the sensor strip 50 illustrating the network panel 14 in phantom. The sensor strip 50 is used with the connectivity management system 10 to determine connectivity of the plugs 36 and the patch cords 38 with the network panels 14. The sensor strip 50 includes a header 52 and one or more flexible circuits 54 interconnecting rigid circuit boards 56 with the header 52. In the illustrated embodiment, the sensor strip 50 includes a first flexible circuit 58 and a second flexible circuit 60. The sensor strip 50 includes a first circuit board 62 and a second circuit board 64. The first flexible circuit 58 interconnects the header 52 and the first circuit board 62. The second flexible circuit 60 interconnects the first circuit board 62 and the second circuit board 64. Signals from the second circuit board 64 are transmitted to the header 52 via the first circuit board 62 and the first flexible circuit 58. It is realized that any number of rigid circuit boards 56 may be provided and a corresponding number of flexible circuits 54 may likewise be provided. Optionally, the number of rigid circuit boards 56 and flexible circuits 54 is the same. Alternatively, more or less flexible circuits 54 may be provided than the number of rigid circuit boards 56.

The header 52 defines an electrical connector having a plurality of contacts 66 for mating with a mating connector, such as one of the cable connectors 42 (shown in FIG. 1). The contacts 66 may be pin contacts, socket contacts or other types of contacts. In the illustrated embodiment, the header 52 is a twenty-four pin header. As shown in FIG. 3, the header 52 may be mounted to the front of the network panel 14.

The flexible circuits 54 are flexible in nature and are configured to be deformed or flexed during use to change shape based on the particular application. The flexible circuits 54 has a flexible body 68 manufactured from a plastic substrate such as a polyimide or a PEEK film. Alternatively, the flexible circuits 54 may be screen printed circuits on a flexible film, such as a polyester film. Other types of flexible circuits may be used in alternative embodiments.

A plurality of traces 70 are arranged along the body 68. The traces 70 are terminated to selected ones of the contacts 66 of the header 52. The traces 70 are also interconnected with the circuit boards 56. The flexible circuits 54 have a length 72 that defines a maximum distance of separation between the components interconnected by the flexible circuits 54. Optionally, the lengths 72 of the flexible circuits 54 may be different than one another. The lengths 72 are selected to accommodate a range of spacing between the interconnect modules 28 and/or the mounting location of the header 52.

The flexibility of the flexible circuits 54 allows the sensor strip 50 to be used on multiple network panels 14. For example, the flexible circuits 54 are flexed to allow for variations in the port group spacing or the spacing between the interconnect modules 28 with differently designed network panels 14. The flexible circuits 54 allow the rigid circuit boards 56 to be moved closer to, or away from, one another and/or from the header 52 depending on the particular mounting location of the interconnect modules 28 and/or the header 52 within the network panel 14. For example, as shown in a FIG. 3, the interconnect modules 28 are spaced apart by a distance 73. Optionally, the width of one of the rails 24 (shown in FIG. 1) between the interface modules 28 may define the distance 73. In alternative designs of network panels 14, the distance between the interface modules 28 may be different than the distance 73 that is shown in FIG. 3. For example, the interface modules 28 may be positioned closer to one another, or the interface modules 28 may be positioned further from one another. The sensor strip 50 may accommodate the different designs by utilizing the flexibility of the flexible circuits 54. For example, by flexing the flexible circuit 54 the spacing between the circuit boards 56 may be changed. The lengths 72 represent a maximum distance of separation. The flexible circuits 54 also allow the circuit boards 56 to have different orientations, such as being angled with respect to one another.

The rigid circuit boards 56 include a rigid body 74 having a mating side 76 and a mounting side 78. The body 74 may be generally box shaped and extend along a longitudinal axis 80 between a first end 82 and a second end 84. The body 74 also includes a top 86 and a bottom 88. The body 74 is elongated along the longitudinal axis 80 between the first and second ends 82, 84. As shown in FIG. 3, the circuit boards 56 are mounted to respective interface modules 28. For example, the mounting side 78 may extend along the mating face 30 of the respective interface modules 28 and may be secured thereto, such as by an adhesive. Optionally, each of circuit boards 56 may be designed to extend along more than one interface modules 28, or alternatively, multiple circuit boards 56 may extend along a single one of the interface modules 28. In an exemplary embodiment, the circuit boards 56 are mounted to the interface modules 28 such that the circuit boards 56 and header 52 are generally aligned with one another along a common plane, such as a plane defined by the mating face 30 of the interface modules 28. The flexible circuits 54 may be non-coplanar with the circuit boards 56, such as when the flexible circuits 54 are flexed. Optionally, only the circuit boards 56 and the header 52 may be mounted to the network panel 14, and the flexible circuits 54 may hang freely between the circuit boards 56 and/or the header 52. Optionally, the sensor strip 50 may be mounted to the panel 20 in addition to, or alternatively to, the interface modules 28.

A plurality of contact pads 90 are provided on the mating side 76. Optionally, the contact pads 90 may be arranged as contact groups 92, such as with two contact pads forming each contact group 92. The contact pads 90 within the contact group 92 are separated from one another by a gap or an insulator. The contact groups 92 are also separated from one another, such as by a gap or by an insulator. The spacing between the contact pads 90 is selected based on the particular application. Different sensor strips 50 may have different spacing between the contact pads 90. In the illustrated embodiment, each of the contact pads 90 have a slant surface 94. The slant surfaces 94 of the contact pads 90 within each contact group 92 complement one another such that the contact pads 90 within each contact group 92 at least partially overlap one another. The slant surfaces 94 may allow the contact pads 90 to be tightly spaced.

Optionally, each of the contact pads 90 may be arranged in a single row along the longitudinal axis 80. Alternatively, the contact pads 90 may be arranged in more than one row. Each of the contact pads 90 are electrically connected to different traces 70 of the flexible circuit 54. Signals received by the contact pads 90 are transmitted along the traces 70 to the header 52.

Figure 4:
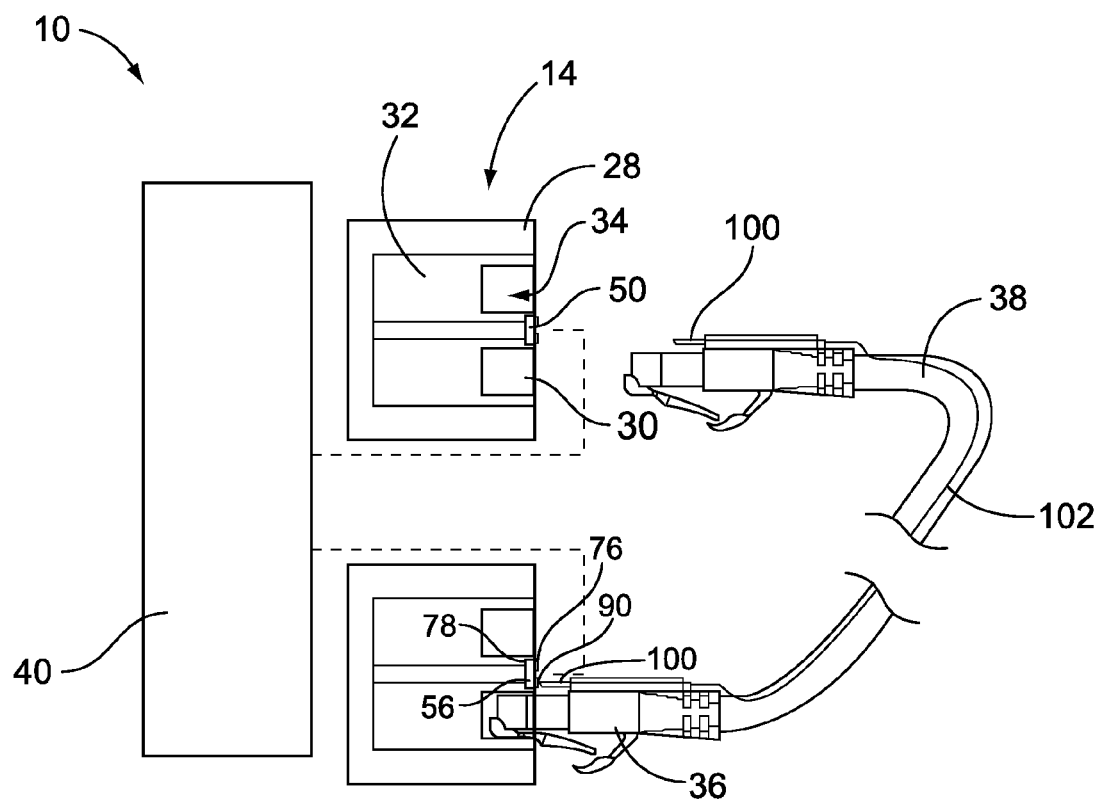
FIG. 4 illustrates interconnection of a patch cable with a network panel utilizing the sensor strip.

FIG. 4 schematically illustrates the connectivity management system 10 with a patch cord 38 being interconnected with network panels 14 that utilize sensor strips 50. FIG. 4 illustrates the interconnect modules 28 and the receptacle jacks 32. The ports 34 are provided in the receptacle jacks 32 at the mating face 30. The sensor strips 50 are mounted to the interconnect modules 28 such that the sensor strips 50 are exposed along the mating face 30. Optionally, the mating sides 76 of the rigid circuit boards 56 of the sensor strips 50 are substantially coplanar with the mating face 30. However, the mating sides 76 may be recessed, or alternatively may extend from, the mating face 30 in alternative embodiments. The mounting sides 78 are mounted to a portion of the interconnect modules 28. For example, the circuit boards 56 may be secured to the interconnect modules 28 by an adhesive. Alternative fastening means or elements may be used in alternative embodiments. The contact pads 90 are exposed for mating with the plugs 36 of the patch cords 38. The contact pads 90 are electrically connected to the analyzer 40.

The patch cord 38 includes sensor probes 100 for establishing a monitoring circuit that can be monitored by the analyzer 40. In an exemplary embodiment, the patch cord 38 incorporates ninth wire technology that includes a wire 102 extending between the plugs 36 at opposite ends of the patch cord 38. The wire 102 is terminated to the sensor probes 100 to create a circuit between the sensor probes 102. In an exemplary embodiment, the sensor probes 102 are spring-loaded pins, such as Pogo pins. As the plugs 36 are loaded into the receptacle jacks 32, the sensor probes 100 engage the contact pads 90 of the sensor strip 50. The sensor strip 50 is thus able to determine when the plugs 36 are mated with corresponding receptacle jacks 32. A signal indicating that the sensor probes 100 are connected to the contact pads 90 is transmitted by the sensor strip 50 to the analyzer 40.

Figure 5:
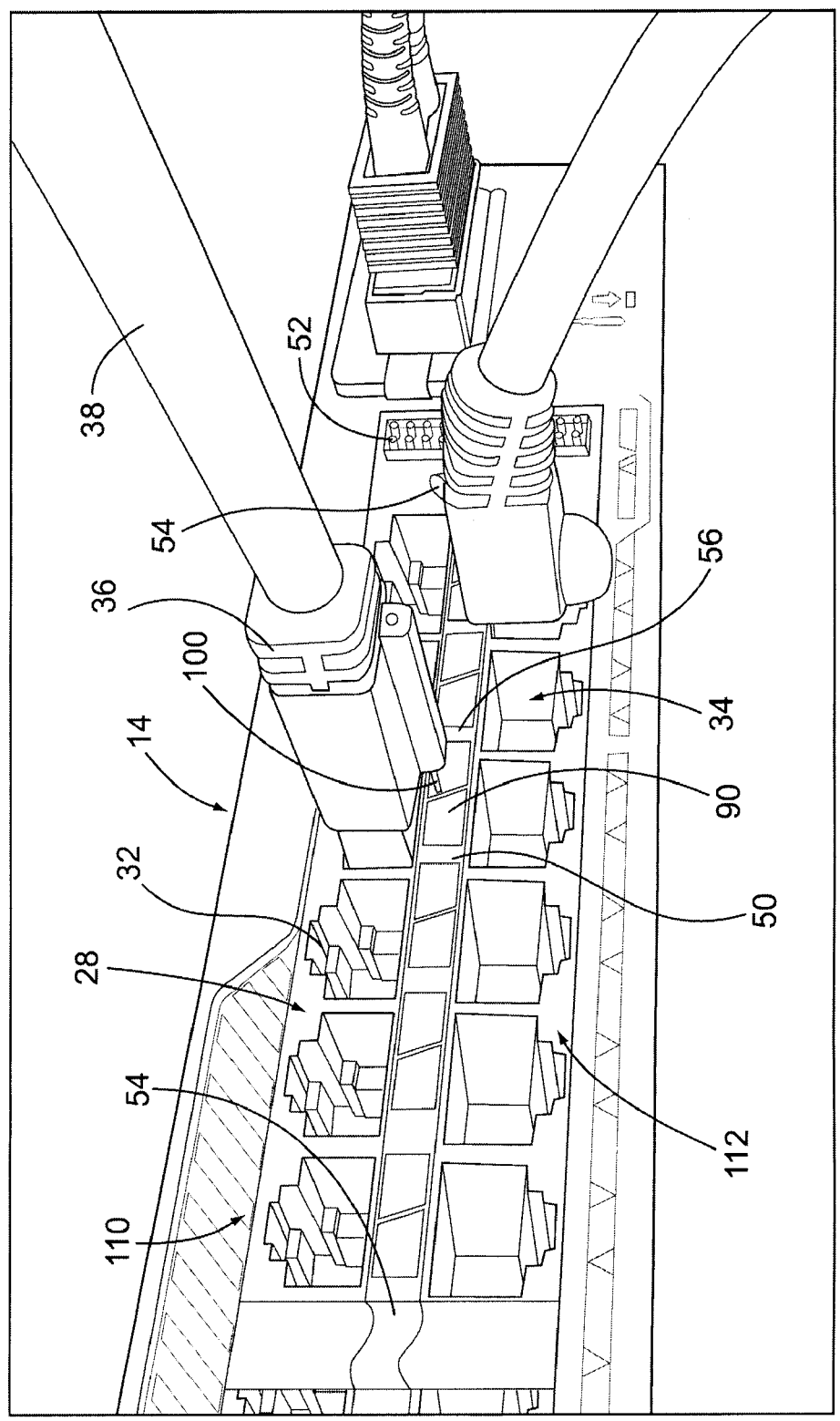
FIG. 5 is a front perspective view of an exemplary network panel utilizing the sensor strip.

FIG. 5 is a front perspective view of a portion of an exemplary network panel 14 utilizing the sensor strip 50. FIG. 5 illustrates a single port group having twelve ports 34 arranged in an upper row 110 and a lower row 112. The ports 34 are stacked directly on top of one another in the two rows 110, 112. The sensor strips 50 are mounted to the network panel 14 generally between the two rows 110, 112 of ports 34. The contact pads 90 are aligned with the respective ports 34. The header 52 is located near the end of the network panel 14. In the illustrated embodiment, the header 52 is positioned in close proximity to the circuit board 56 and the flexible circuit 54 is folded therebetween. In an alternative embodiment, the header 52 may be positioned a greater distance away from the circuit board 56 such that the flexible circuit 54 is substantially stretched between the circuit board 56 and the header 52.

A plurality of patch cords 38 are coupled to the interconnect module 28. For example, one patch cord 38 is plugged into one of the receptacle jacks 32 in the lower row 112 and another patch cord 38 is plugged into one of the receptacle jacks 32 in the upper row 110. The sensor probes 100 of the plugs 36 of the patch cords 38 mated with the interconnect module 28 engage respective contact pads 90 of the sensor strip 50.

Figure 6:
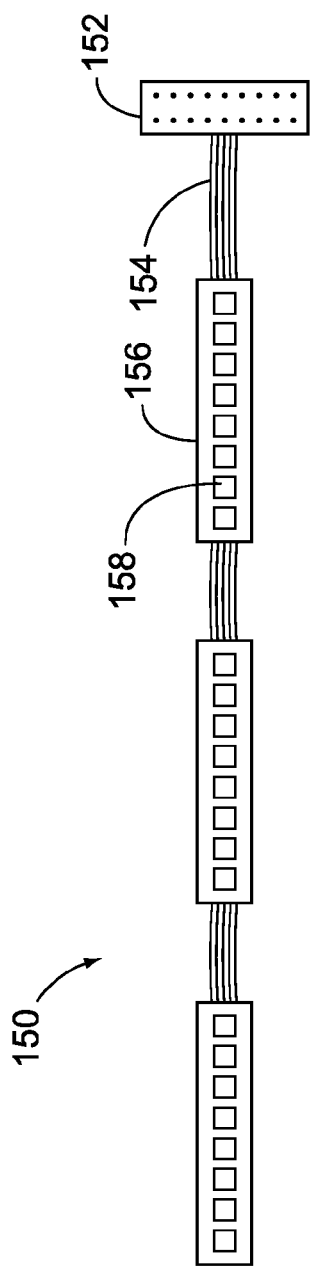
FIG. 6 illustrates an alternative sensor strip.

FIG. 6 illustrates an alternative sensor strip 150. The sensor strip 150 is similar to the sensor strip 50 (shown in FIG. 2), however the sensor strip 150 is for use with a network panel having a different port configuration then the network panel 14 (shown in FIG. 1). The sensor strip 150 includes a header 152, a plurality of flexible circuits 154, and a plurality of rigid circuit boards 156. The circuit boards 156 include a plurality of contact pads 158 arranged in a single row. In the illustrated embodiment, eight contact pads 158 are provided. Each of the contact pads 158 are separated by a gap. The sensor strip 150 is for use with a network panel having interconnect modules having eight receptacle jacks arranged in a single row. In the illustrated embodiment, the sensor strip 150 includes three circuit boards 156 and three flexible circuits 154 interconnecting the circuit boards 156 in the header 152.

Figure 7:
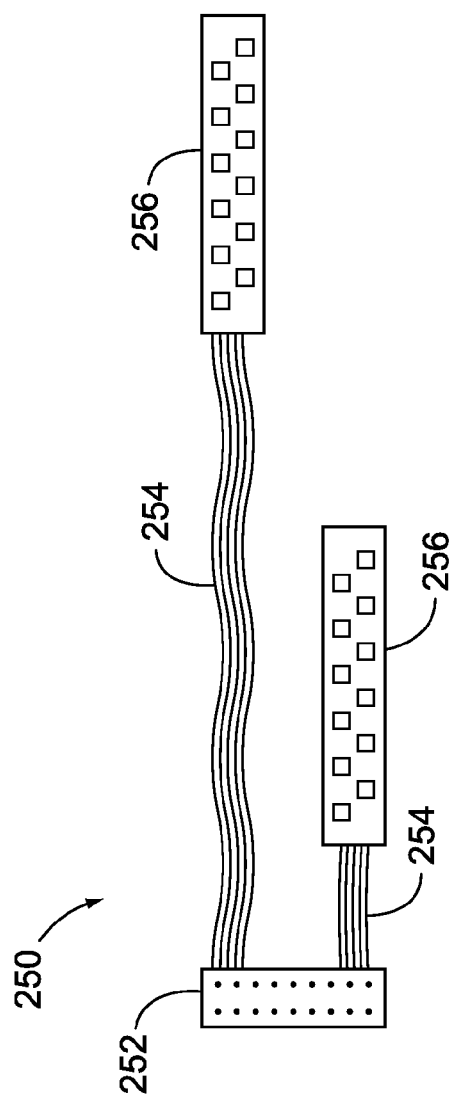
FIG. 7 illustrates another alternative sensor strip.

FIG. 7 illustrates another alternative sensor strip 250. The sensor strip 250 is similar to the sensor strip 50 (shown in FIG. 2). The sensor strip 250 includes a header 252, a plurality of flexible circuits 254, and a plurality of rigid circuit boards 256. Each of the circuit boards 256 are directly connected to the header 252 by a respective flexible circuit 254 as opposed to having a flexible circuit connected between the two circuit boards 256. Optionally, the flexible circuits 254 may have different lengths so that one of the circuit boards 256 may be positioned further from the header 252. The circuit boards 256 may be arranged in line with one another when mounted to the network panel. Alternatively, the flexible circuits 254 may allow the circuit boards 256 to be arranged at different elevations within the network panel. Optionally, the two circuit boards 256 may be mounted to different network panels, such as on network panels that are stacked on top of one another. The flexible circuits 254 allow flexibility in the mounting locations of the circuit boards 256.

A sensor strip 50 is thus provided that may be used with a connectivity management system 10 that determines connectivity of patch cords within the system. The sensor strip 50 includes the header 52 for connecting the sensor strip 50 to the analyzer 40, and the sensor strip 50 includes one or more flexible circuits 54 that interconnect rigid circuit boards 56 to the header 52. The rigid circuit boards 56 may be mounted to interconnect modules 28 of a network panel 14 for interfacing with sensor probes 100 of plugs 36 that are mated with the interconnect modules 28. For example, when the plugs 36 are loaded into the receptacle jacks 32 of the interconnect modules 28 the sensor probes 100 engage contact pads 90 on the circuit boards 56. A signal may be transmitted from the sensor probe 100 to the contact pad 90 and ultimately to the header 52 via the flexible circuits 54. The flexible circuits 54 allow the sensor strip 50 to be used with various different types of network panels 14. For example, the flexibility of the flexible circuits 54 allow the circuit boards 56 to be mounted in a range of different positions with respect to one another and also allow the header 52 to be variably positioned with respect to the circuit boards 56. The sensor strip 50 is thus modular in nature and accommodates a wide range of network panels 14.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A network panel comprising:
    a panel having a plurality of openings;
    interconnect modules received in the openings, each interconnect module having a mating face and a plurality of receptacle jacks, each receptacle jack having an opening defining a port at the mating face configured to receive a plug of a patch cord having a sensing probe; and
    a sensor strip having a header and one or more flexible circuits interconnecting one or more rigid circuit boards with the header, each of the circuit boards having contact pads, the sensor strip being mounted to at least one of the panel and the interconnect modules such that the contact pads are aligned with respective receptacle jacks, the contact pads being configured to interface with sensing probes when the plugs are mated with the receptacle jacks.

2. The network panel of claim 1, wherein the sensor strip includes first and second circuit boards, a first flexible circuit connects the first circuit board with the header and a second flexible circuit connects the second circuit board with the first circuit board.

3. The network panel of claim 1, wherein the spacing between the circuit boards may be varied by flexing the flexible circuits.

4. The network panel of claim 1, wherein the circuit boards are aligned with one another along a plane, one of the flexible circuits extends between adjacent circuit boards, portions of the flexible circuit being configured to be non-coplanar with the circuit boards.

5. The network panel of claim 1, wherein one of the flexible circuits extends between the header and a first of the circuit boards, the spacing between the header and the first circuit board may be varied by flexing the flexible circuit.

6. The network panel of claim 1, wherein the receptacle jacks are arranged with respect to one another to define a port group, the contact pads having a pad configuration that complements the port group.

7. The network panel of claim 1, wherein the flexible circuits are configured to send a signal to the header when at least one of the contact pads is engaged by the sensor probe.

8. The network panel of claim 1, wherein the receptacle jacks are arranged in a plurality of rows within the interconnect module, the sensor strip is mounted to the interconnect module between the rows of receptacle jacks.

9. The network panel of claim 1, wherein the circuit board includes a mating side and a mounting side, the contact pads are arranged on the mating side, and the mounting side is mounted to the corresponding interconnect module.

10. A sensor strip for a connectivity management system utilizing sensor probes to determine connectivity of plugs, the sensor strip comprising:
   a header for connecting the sensor strip to other components of the connectivity management system;
   a plurality of rigid circuit boards, each of the circuit boards having contact pads configured to be aligned with receptacle jacks for interfacing with the sensor probes of the plugs; and
   a plurality flexible circuits interconnecting the circuit boards with the header.

11. The sensor strip of claim 10, wherein the contact pads are arranged in a pad configuration having each pad aligned with the corresponding receptacle jack so that the sensor probe of the plug engages the contact pad when the plug is loaded into the receptacle jack.

12. The sensor strip of claim 10, wherein the circuit board is elongated along a longitudinal axis between opposed ends, the contacts being arranged in a row along the longitudinal axis.

13. The sensor strip of claim 10, wherein the sensor strip includes first and second circuit boards, a first flexible circuit connects the first circuit board with the header and a second flexible circuit connects the second circuit board with the first circuit board.

14. The sensor strip of claim 10, wherein the spacing between the circuit boards may be varied by flexing the flexible circuits.

15. The sensor strip of claim 10, wherein one of the flexible circuits extends between the header and a first of the circuit boards, the spacing between the header and the first circuit board may be varied by flexing the flexible circuit.

16. The sensor strip of claim 10, wherein the circuit board includes a mating side and a mounting side, the contact pads are arranged on the mating side and the mounting side is configured to be mounted to an interconnect module housing the receptacle jacks.

17. The sensor strip of claim 10, wherein the flexible circuit includes traces that are electrically connected to selected ones of the contact pads.

18. A connectivity management system comprising:
   an analyzer configured to determine connectivity of plugs having sensor probes;
   a network panel having a panel and a plurality of the interconnect modules coupled to the panel, each interconnect module having a plurality of receptacle jacks with ports configured to receive the plugs; and
   a sensor strip having a header and a plurality of flexible circuits interconnecting a plurality of rigid circuit boards with the header, the header is configured to electrically connect to the analyzer by a cable, each of the circuit boards having contact pads, the sensor strip being mounted to the network panel such that the contact pads are aligned with respective receptacle jacks, the contact pads being configured to interface with the sensing probes when the plugs are mated with the receptacle jacks.

19. The connectivity management system of claim 18, wherein the contact pads are arranged in a pad configuration having each pad aligned with the corresponding receptacle jack so that the sensor probe of the plug engages the contact pad when the plug is loaded into the receptacle jack.

20. The connectivity management system of claim 18, wherein the sensor strip is coupled to the network panel such that the circuit boards extend along a mating face of the respective interconnect module so that the contact pads interface with the sensor probes as the plugs are loaded into the receptacle jacks, wherein a signal from the sensor probe is transmitted to the analyzer by at least one of the flexible circuits and the header.

* * * * *